US011933849B2

(12) United States Patent
Lin et al.

(10) Patent No.: US 11,933,849 B2
(45) Date of Patent: Mar. 19, 2024

(54) INDUCTANCE DETECTION METHOD OF RELUCTANCE MOTOR AND MOTOR DETECTION DEVICE

(71) Applicant: Delta Electronics, Inc., Taoyuan (TW)

(72) Inventors: Yu-Shian Lin, Taoyuan (TW); Tung-Chin Hsieh, Taoyuan (TW); Ming-Tsung Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 181 days.

(21) Appl. No.: 17/748,963

(22) Filed: May 19, 2022

(65) Prior Publication Data

US 2023/0228819 A1 Jul. 20, 2023

(30) Foreign Application Priority Data

Jan. 18, 2022 (CN) .......................... 202210053321.2

(51) Int. Cl.
*G01R 31/34* (2020.01)
*G01R 27/02* (2006.01)
*H02P 25/08* (2016.01)

(52) U.S. Cl.
CPC ............. *G01R 31/34* (2013.01); *G01R 27/02* (2013.01); *H02P 25/08* (2013.01)

(58) Field of Classification Search
CPC ...... G01R 31/34; G01R 27/02; G01R 31/343; G01R 27/2611; H02P 25/08; H02P 6/183
USPC ........................ 318/490, 400.02, 400.01, 700
See application file for complete search history.

(56) References Cited

U.S. PATENT DOCUMENTS

| 8,125,170 B2 * | 2/2012 | Fahimi | ................... G01R 31/34 318/400.34 |
|---|---|---|---|
| 9,188,648 B2 | 11/2015 | Eskola et al. | |
| 2021/0116507 A1 | 4/2021 | Tsai et al. | |

(Continued)

FOREIGN PATENT DOCUMENTS

| CN | 1180275 C | 12/2004 |
|---|---|---|
| CN | 102714480 A | 10/2012 |
| CN | 102763324 A | 10/2012 |

(Continued)

*Primary Examiner* — David Luo
(74) *Attorney, Agent, or Firm* — KIRTON McCONKIE; Evan R. Witt

(57) ABSTRACT

The present disclosure provides an inductance detection method includes steps of: (a) acquiring a stator resistance of the reluctance motor; (b) injecting a high-frequency sinusoidal signal in the d-axis or q-axis direction; (c) injecting an align signal command in the q-axis or d-axis direction; (d) receiving a dq-axes signal generated through injecting the high-frequency sinusoidal signal and the align signal command; (e) sampling a motor feedback signal generated through receiving the dq-axes signal; (f) in the direction of injecting the high-frequency sinusoidal signal, calculating an amplitude difference between the high-frequency sinusoidal signal and the motor feedback signal, and adjusting an amplitude of the high-frequency sinusoidal signal according to the amplitude difference for regulating a feedback amplitude of the motor feedback signal; and (g) when the feedback amplitude reaching an expected amplitude, calculating an apparent inductance of the reluctance motor based on the dq-axes signal, the motor feedback signal and the stator resistance.

14 Claims, 18 Drawing Sheets

(56) References Cited

U.S. PATENT DOCUMENTS

2021/0132150 A1    5/2021   Chen et al.

FOREIGN PATENT DOCUMENTS

| CN | 102565540 B | 9/2015 |
| CN | 104811115 B | 3/2017 |
| CN | 108988722 A | 12/2018 |
| CN | 111917350 A | 11/2020 |
| CN | 113300647 A | 8/2021 |
| TW | I469501 B | 1/2015 |

* cited by examiner

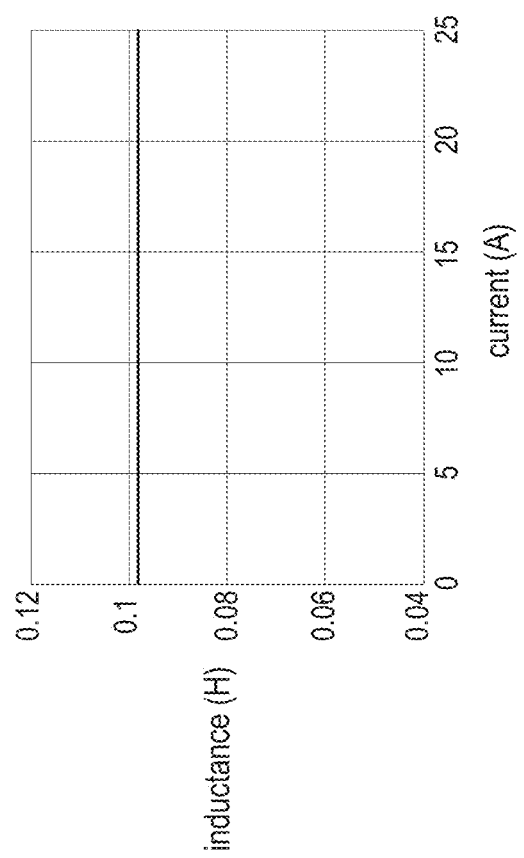

INDUCTANCE DETECTION METHOD OF RELUCTANCE MOTOR AND MOTOR DETECTION DEVICE

CROSS-REFERENCE TO RELATED APPLICATION

This application claims priority to China Patent Application No. 202210053321.2, filed on Jan. 18, 2022, the entire contents of which are incorporated herein by reference for all purposes.

FIELD OF THE INVENTION

The present disclosure relates to a motor detection device and method, and more particularly to an inductance detection method of reluctance motor and a motor detection device.

BACKGROUND OF THE INVENTION

Synchronous reluctance motor has the advantages of high efficiency, low cost and steady structure, and has the characteristics of permanent magnet and induction motors. Under the trade-off between new energy policy and equipment renewal cost, the synchronous reluctance motor has high development potential.

The synchronous reluctance motor is mainly used in the driving applications that don't require fast response, such as fans and water pump. Accordingly, the open-loop control, which is easy to use and has a high tolerance for parameters, would be more favored by users. In open-loop control, the required motor parameters should be firstly obtained. FIG. 1 shows the conventional parameter detection method. As shown in FIG. 1, the high-frequency voltage signal is injected, then the average virtual power is calculated through the cross product of the feedback current and voltage, and the average inductance under this current is calculated according to the average virtual power. However, in this manner, since the average inductance under a certain current level is calculated according to the average virtual power, each independent inductance data needs to be acquired according to the average virtual power calculated based on the current and voltage of a plurality of electrical cycles. In other words, when the required data points are too much or too concentrated, the overall detection process would become long and tedious.

Therefore, there is a need of providing an inductance detection method of reluctance motor and a motor detection device to obviate the drawbacks encountered from the prior arts.

SUMMARY OF THE INVENTION

It is an objective of the present disclosure to provide an inductance detection method of reluctance motor and a motor detection device, which can acquire the apparent inductance curve of the reluctance motor quickly with the rotor of the reluctance motor in the static state. Consequently, the parameter detection time is shortened, and meanwhile the resolution of the data points is improved.

In accordance with an aspect of the present disclosure, there is provided an inductance detection method of reluctance motor. The inductance detection method includes steps of: (a) injecting DC current signals with different signal levels in a d-axis direction, injecting a zero current in a q-axis direction, and acquiring a stator resistance of the reluctance motor accordingly; (b) injecting a high-frequency sinusoidal signal in the d-axis direction or the q-axis direction; (c) injecting an align signal command in the q-axis direction or the d-axis direction; (d) receiving a dq-axes signal generated through injecting the high-frequency sinusoidal signal and the align signal command; (e) sampling a motor feedback signal generated through receiving the dq-axes signal; (f) in the direction of injecting the high-frequency sinusoidal signal, calculating an amplitude difference between the high-frequency sinusoidal signal and the motor feedback signal, and adjusting an amplitude of the high-frequency sinusoidal signal according to the amplitude difference for regulating a feedback amplitude of the motor feedback signal; and (g) when the feedback amplitude reaching an expected amplitude, calculating an apparent inductance of the reluctance motor based on the dq-axes signal, the motor feedback signal and the stator resistance.

In accordance with another aspect of the present disclosure, there is provided a motor detection device configured to detect an apparent inductance of a reluctance motor. The motor detection device includes a signal control circuit, a motor driving circuit and a feedback control circuit. The signal control circuit is configured to output a dq-axes signal. The motor driving circuit receives the dq-axes signal to generate a driving signal. The feedback control circuit includes a stator resistance of the reluctance motor. The feedback control circuit samples the driving signal to generate a motor feedback signal. The signal control circuit receives a high-frequency sinusoidal signal injected in a d-axis direction or a q-axis direction and an align signal command injected in the q-axis direction or the d-axis direction to generate the dq-axes signal. In the direction of injecting the high-frequency sinusoidal signal, the signal control circuit calculates an amplitude difference between the high-frequency sinusoidal signal and the motor feedback signal, and the signal control circuit modifies an amplitude of the high-frequency sinusoidal signal according to the amplitude difference for regulating a feedback amplitude of the motor feedback signal. When the feedback control circuit detects that the feedback amplitude reaches an expected amplitude, the feedback control circuit calculates the apparent inductance based on the dq-axes signal, the motor feedback signal and the stator resistance.

BRIEF DESCRIPTION OF THE DRAWINGS

FIG. 9C schematically shows the inductance-current curve under the circumstance that the inductor of the RL circuit in FIG. 7 is a linear inductor;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
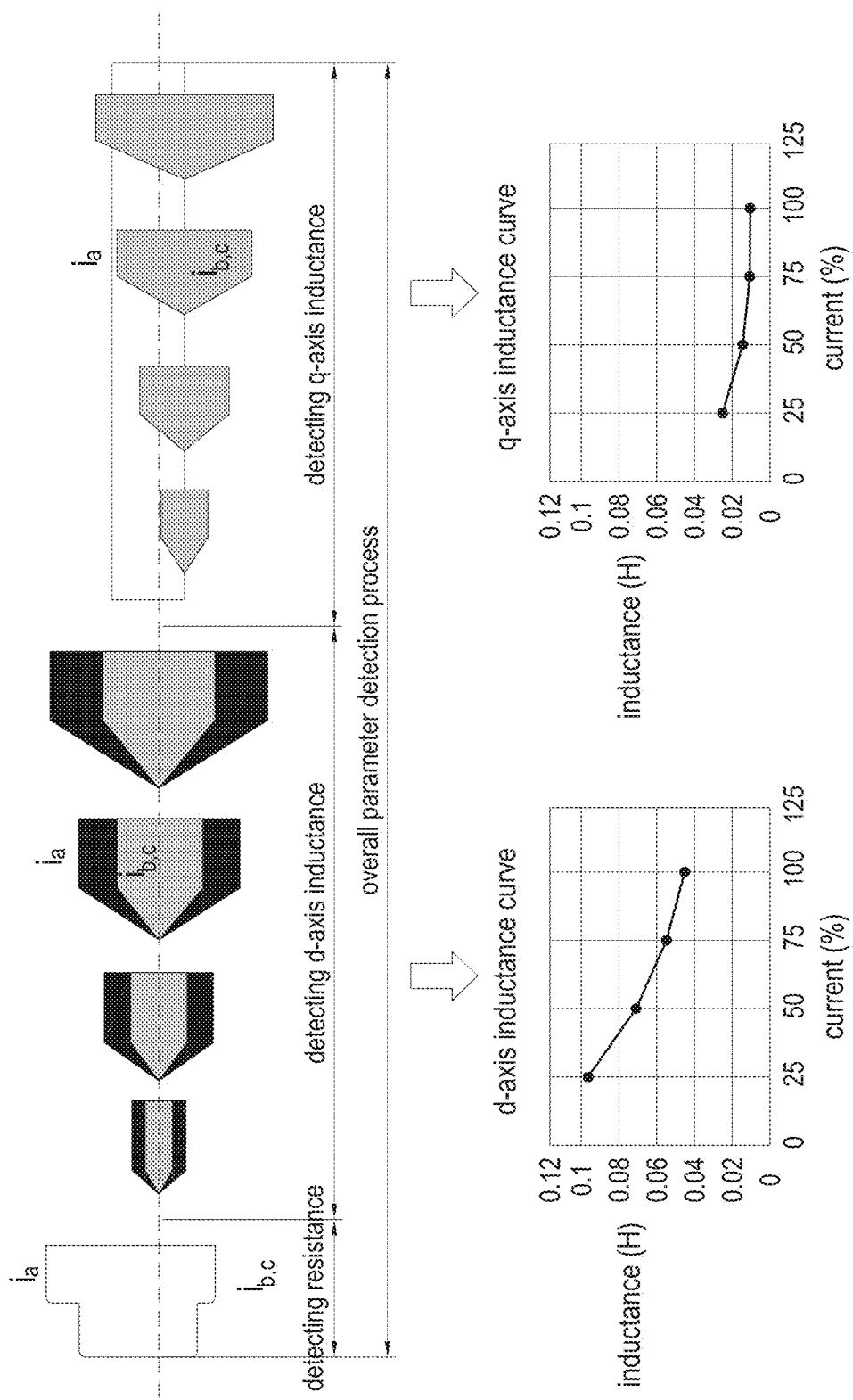
FIG. 1 shows the conventional parameter detection method.
Figure 2:
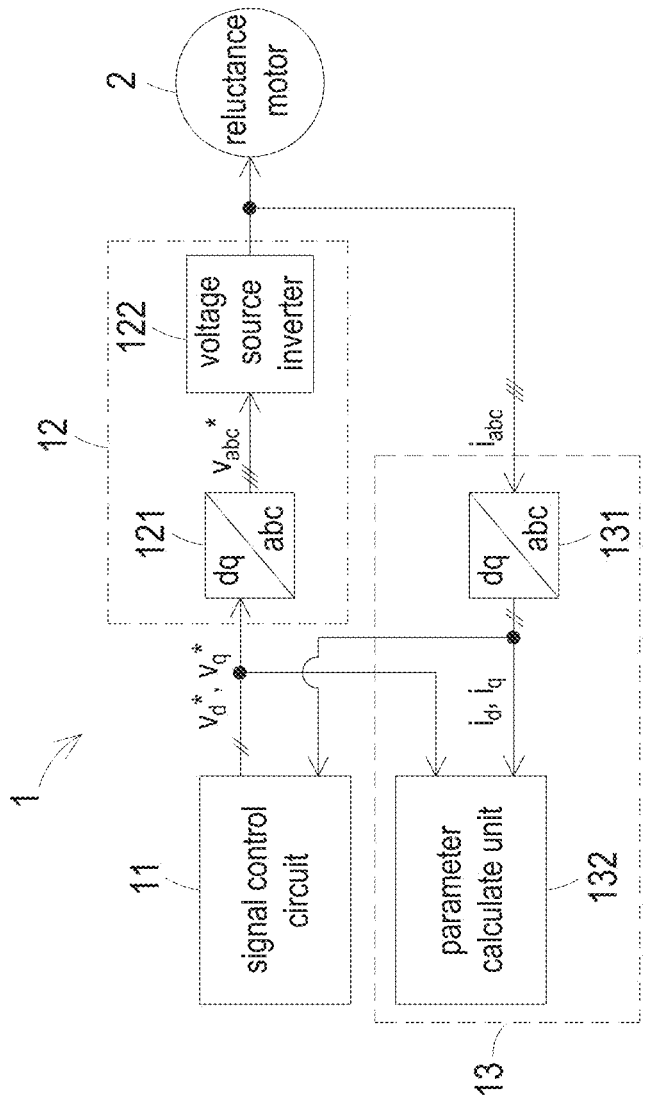
FIG. 2 is a schematic block diagram illustrating a motor detection device according to an embodiment of the present disclosure.

FIG. 2 is a schematic block diagram illustrating a motor detection device according to an embodiment of the present disclosure. As shown in FIG. 2, the motor detection device 1 is utilized to detect an apparent inductance of the reluctance motor 2. The motor detection device 1 includes a signal control circuit 11, a motor driving circuit 12, and a feedback control circuit 13 electrically connected to each other. The motor driving circuit 12 and the feedback control circuit 13 are electrically connected to the reluctance motor 2. The signal control circuit 11 is configured to output a dq-axes signal. The motor driving circuit 12 receives the dq-axes signal to generate a driving signal, and the three-phase current value of the driving signal is represented by iabc. The feedback control circuit 13 includes a stator resistance of the reluctance motor 2. The feedback control circuit 13 samples the driving signal to generate a motor feedback signal, and provides the motor feedback signal to the signal control circuit 11. The signal control circuit 11 receives a high-frequency sinusoidal signal injected in the d-axis direction or the q-axis direction, and receives an align signal command injected in the q-axis direction or the d-axis direction correspondingly, so as to generate the dq-axes signal. In the direction of injecting the high-frequency sinusoidal signal, the signal control circuit 11 calculates an amplitude difference between the high-frequency sinusoidal signal and the motor feedback signal, and modifies the amplitude of the high-frequency sinusoidal signal according to the amplitude difference for regulating a feedback amplitude of the motor feedback signal. When the feedback control circuit 13 detects that the feedback amplitude reaches an expected amplitude, the feedback control circuit 13 calculates the apparent inductance based on the dq-axes signal, the motor feedback signal, and the stator resistance.

The signal control circuit 11 may include a signal generator, but not limited thereto. In an embodiment, the motor driving circuit 12 includes a first transformation 121 and a voltage source inverter 122. The first transformation 121 is electrically connected to the signal control circuit 11. The first transformation 121 receives the dq-axes signal and converts the dq-axes signal in the dq-axes coordinate system into a three-phase signal in the three-phase coordinate system, where the three-phase voltage value of the three-phase signal is represented by vabc*. The voltage source inverter 122 is electrically connected between the first transformation 121 and the reluctance motor 2, and is configured to convert the three-phase signal into the driving signal for driving the reluctance motor 2. The voltage source inverter 122 may adopt pulse width modulation, but not limited thereto. In an embodiment, the feedback control circuit 13 includes a second transformation 131 and a parameter calculate unit 132. The second transformation 131 is electrically connected to the motor driving circuit 12, the reluctance motor 2, and the signal control circuit 11. The second transformation 131 samples the driving signal and converts the driving signal in the three-phase coordinate system into the motor feedback signal in the dq-axes coordinate system, and then the second transformation 131 provides the motor feedback signal to the signal control circuit 11. The parameter calculate unit 132 is electrically connected to the second transformation 131 and the signal control circuit 11 for receiving the dq-axes signal and the motor feedback signal. The parameter calculate unit 132 is configured to calculate the apparent inductance based on the dq-axes signal, the motor feedback signal, and the stator resistance.

Figure 3:
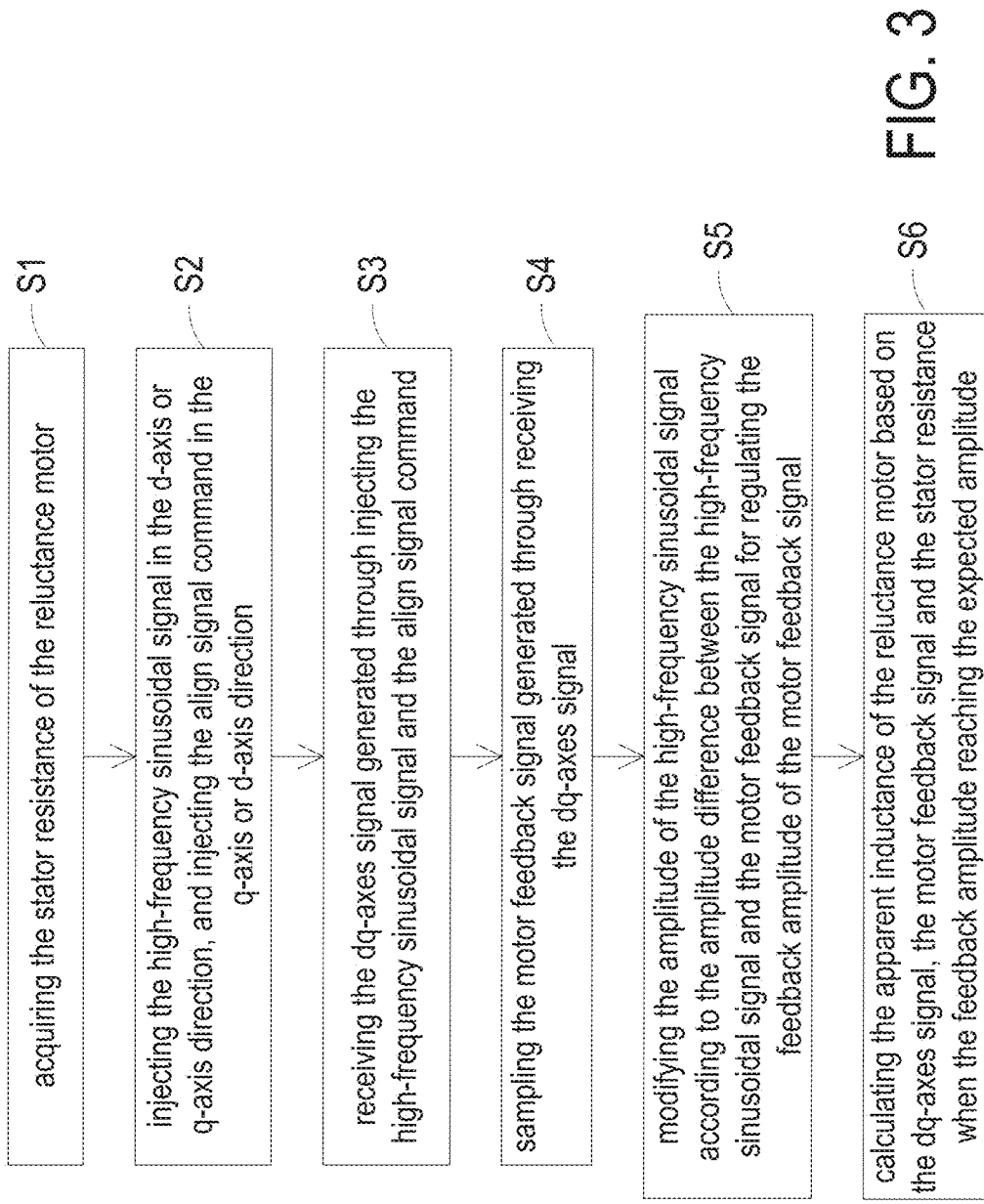
FIG. 3 is a schematic flow chart illustrating an inductance detection method of reluctance motor according to an embodiment of the present disclosure.

FIG. 3 is a schematic flow chart illustrating an inductance detection method of reluctance motor according to an embodiment of the present disclosure. The inductance detection method is utilized to detect the apparent inductance of the reluctance motor 2 and is applicable to the motor detection device 1 of FIG. 2. As shown in FIG. 3, firstly, the DC current signals with different signal levels are injected in the d-axis direction, a zero current is injected in the q-axis direction, and the stator resistance of the reluctance motor 2 is acquired accordingly (step S1). It is noted that the stator resistance of the reluctance motor 2 is preset in the feedback control circuit 13 of the motor detection device 1, thus the step S1 can be omitted when the inductance detection method is executed by the motor detection device 1. Then, the high-frequency sinusoidal signal is injected in the d-axis direction or q-axis direction, and the align signal command is injected in the q-axis direction or d-axis direction (step S2). Then, the dq-axes signal generated through injecting the high-frequency sinusoidal signal and the align signal command is received (step S3), and the motor feedback signal generated through receiving the dq-axes signal is sampled (step S4). Afterwards, in the direction of injecting the high-frequency sinusoidal signal, the amplitude difference between the high-frequency sinusoidal signal and the motor feedback signal is calculated, and the amplitude of the high-frequency sinusoidal signal is modified according to the amplitude difference for regulating the feedback amplitude of the motor feedback signal (step S5). When the feedback amplitude of the motor feedback signal reaches the expected amplitude, the apparent inductance of the reluctance motor 2 is calculated based on the dq-axes signal, the motor feedback signal and the stator resistance (step S6).

Figure 4:
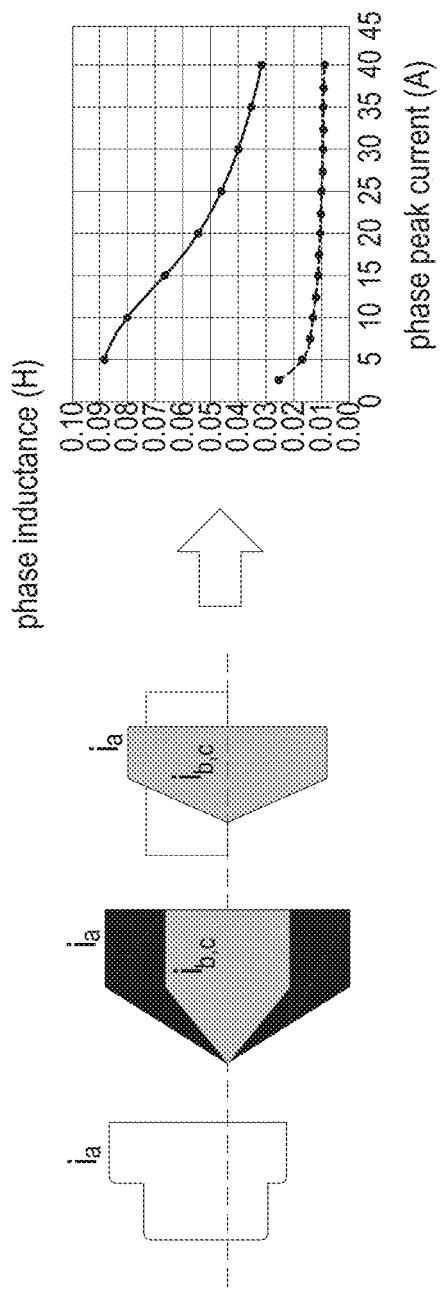
FIG. 4 schematically shows the current waveform and the inductance-current curve during the parameter detection process.

From the above descriptions, the inductance detection method of the reluctance motor 2 and the motor detection device 1 of the present application can acquire the apparent inductance curve of the reluctance motor 2 quickly with the rotor of the reluctance motor 2 in the static state. Further, as shown in FIG. 4, in the present disclosure, the parameter detection time is shortened, and the resolution of the data points is improved. In FIG. 4, the inductance-current curves of the reluctance motor 2 in the d-axis and q-axis are depicted by a solid line and a dashed line respectively.

The following would describe how to acquire the stator resistance of the reluctance motor 2 and the inductance curves on the d-axis and q-axis in detail. For ease of understanding, the following descriptions are based on the inductance detection method executed by the motor detection device 1.

The equations of the d-axis and q-axis voltages of the reluctance motor 2 are as follows:

$$v_d = R_s i_d + L_d p i_d - \omega_r L_q i_q \qquad (1),$$

$$v_q = R_s i_q + L_q p i_q + \omega_r L_d i_d \qquad (2),$$

where $v_d$ is the d-axis voltage of the reluctance motor 2, $R_s$ is the stator resistance of the reluctance motor 2, $i_d$ is the d-axis current component of the motor feedback signal, $L_d$ is the d-axis inductance of the reluctance motor 2, $\omega_r$ is the rotor angular velocity of the reluctance motor 2, $v_q$ is the q-axis voltage of the reluctance motor 2, $i_q$ is the q-axis current component of the motor feedback signal, and $L_q$ is the q-axis inductance of the reluctance motor 2.

Since the DC current signal and the zero current are injected in the d-axis direction and the q-axis direction respectively during the process of acquiring the stator resistance $R_s$ the differential term and the rotor angular velocity co, are zero in the steady state. Accordingly, the equations (1) and (2) become:

$$v_d = R_s i_d \qquad (3),$$

$$v_q = R_s i_q \qquad (4).$$

Figure 5:
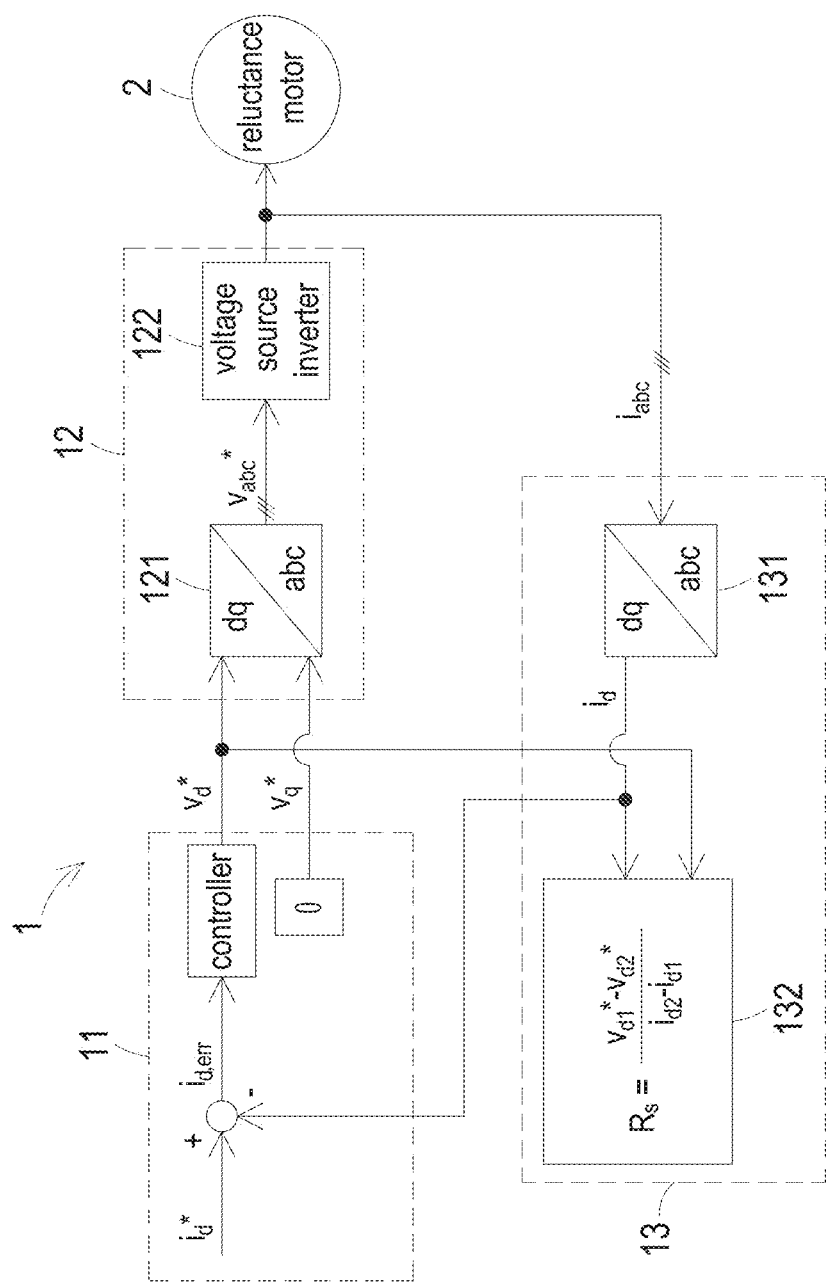
FIG. 5 schematically shows an implementation of acquiring a stator inductance of the reluctance motor.

In an embodiment, as shown in FIG. 5, the signal control circuit 11 is a proportional control circuit, and the process of acquiring the stator resistance $R_s$ of the reluctance motor 2 includes the following steps. Firstly, the DC current signals with a first signal level $i_{d1}*$ and a second signal level $i_{d2}*$ are received sequentially. Then, the first feedback d-axis component $i_{d1}$ and the second feedback d-axis component $i_{d2}$ of the motor feedback signal generated according to the first and second signal levels $i_{d1}*$ and $i_{d2}*$ respectively are sample sequentially. Afterwards, the first feedback d-axis component in is subtracted from the first signal level $i_{d1}*$ by the proportional control circuit, and the first d-axis component $v_{d1}*$ of the dq-axes signal is obtained according to the subtraction result $i_{d,err1}$. The second feedback d-axis component $i_{d2}$ is subtracted from the second signal level $i_{d2}*$ by the proportional control circuit, and the second d-axis component $v_{d2}*$ of the dq-axes signal is obtained according to the subtraction result $i_{d,err2}$. Finally, after the second d-axis component $v_{d2}*$ is controlled to maintain in the steady state, the current variation between the first feedback d-axis component $i_{d1}$ and the second feedback d-axis component $i_{d2}$ is calculated, the voltage variation between the first d-axis component $v_{d1}*$ and the second d-axis component $v_{d2}*$ is calculated, and the voltage variation is divided by the current variation to acquire the stator resistance $R_s$.

In another embodiment, the signal control circuit 11 is a proportional-integral control circuit (not shown), and the process of acquiring the stator resistance $R_s$ of the reluctance motor 2 includes the following steps. Firstly, the DC current signals with the first signal level $i_{d1}*$ and the second signal level $i_{d2}*$ are received sequentially. Then, the first d-axis component $v_{d1}*$ and the second d-axis component $v_{d2}*$ of the dq-axes signal generated according to the first and second signal levels $i_{d1}*$ and $i_{d2}*$ respectively are sample sequentially. Finally, after the second d-axis component $v_{d2}*$ is controlled to maintain in the steady state, the current variation between the first signal level ice and the second signal level $i_{d2}*$ is calculated, the voltage variation between the first d-axis component $v_{d1}*$ and the second d-axis component $v_{d2}*$ is calculated, and the voltage variation is divided by the current variation to acquire the stator resistance $R_s$.

In the present disclosure, the stator resistance of the reluctance motor 2 is acquired by calculating the variation slopes of voltage and current of two stages. Accordingly, the potential output voltage deviation caused by non-ideal hardware is eliminated. In some other embodiments, the stator resistance $R_s$ is a software set value included in the feedback control circuit 13.

The principle of acquiring the inductance curves of the reluctance motor 2 in the d-axis and q-axis is explained as follows.

Figure 6:
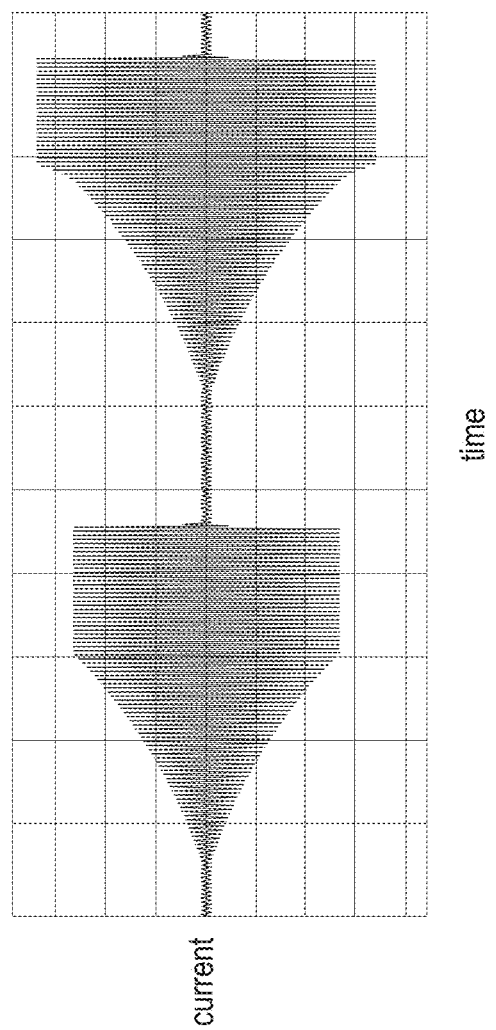
FIG. 6 schematically shows the current waveform while applying an ideal sinusoidal voltage with fixed frequency and increasing amplitude on the reluctance motor.

As shown in FIG. 6, when an ideal sinusoidal voltage with fixed frequency and increasing amplitude is applied to the reluctance motor 2, the current varies in a parabolic-shape waveform rather than a linear sinusoidal waveform with increasing amplitude, which is similar to the waveform of voltage. According to the d-axis and q-axis voltage equations of the reluctance motor 2 (i.e., the equations (1) and (2) stated above), when the reluctance motor 2 is not rotating, the relations between the voltage and current on the d-axis and q-axis are:

$$v_d = R_s i_d + L_d p i_d \qquad (5),$$

$$v_q = R_s i_q + L_q p i_q \qquad (6).$$

Figure 7:
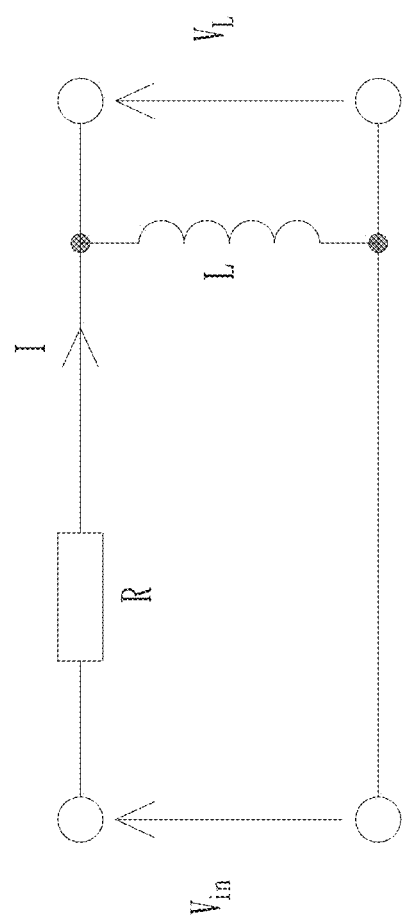
FIG. 7 is a schematic circuit diagram illustrating a typical RL circuit.
Figure 8:
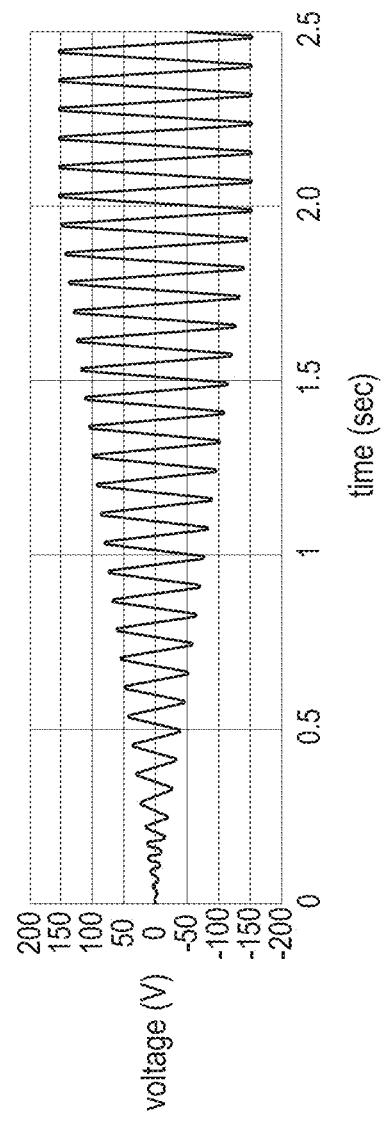
FIG. 8 schematically shows the waveform of the input voltage of the RL circuit in FIG. 7.
Figure 9A:
FIG. 9A and FIG. 9B schematically show the current waveform under the circumstance that the inductor of the RL circuit in FIG. 7 is a linear inductor.
Figure 9B:
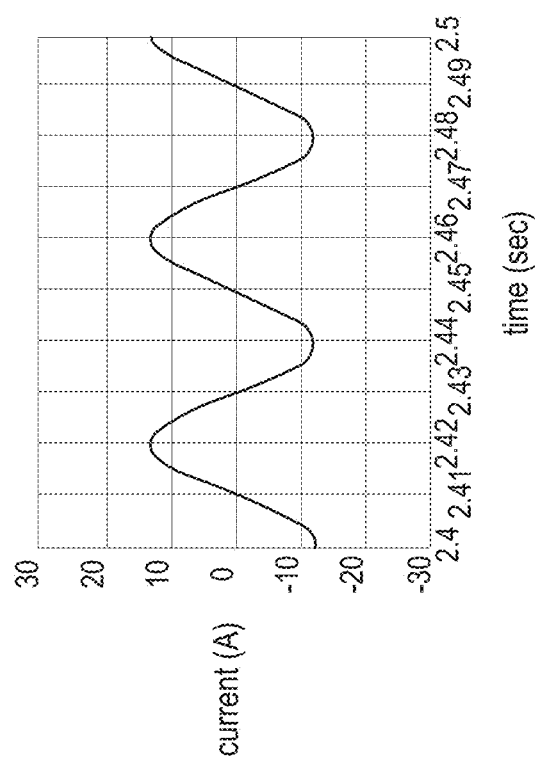
Figure 10A:
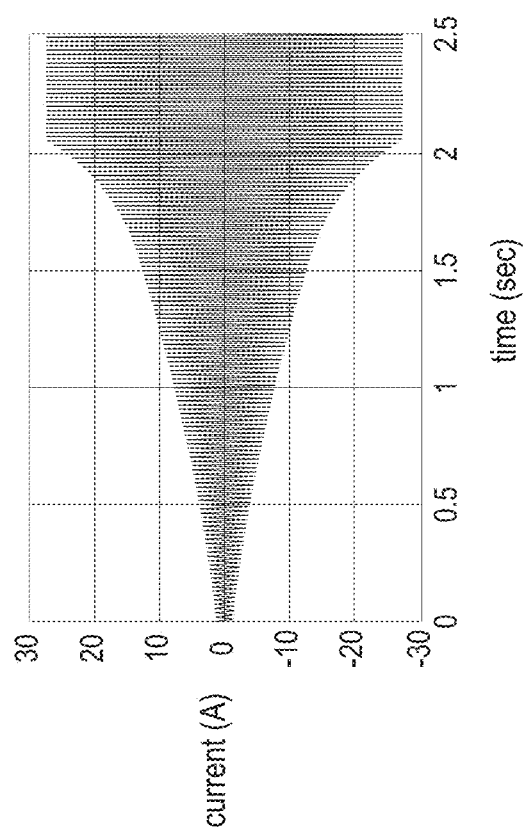
FIG. 10A and FIG. 10B schematically show the current waveform under the circumstance that the inductor of the RL circuit in FIG. 7 is a nonlinear inductor.
Figure 10B:
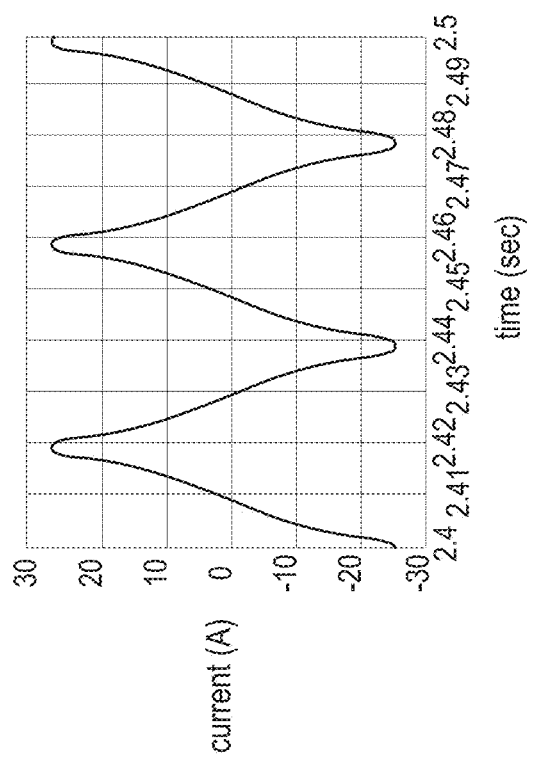

These relations between the voltage and current may be equivalent to a typical RL circuit (as shown in FIG. 7). Since the resistance in the RL circuit is only affected by the temperature, the nonlinear variation of the current should be caused by the saturation characteristic of the inductor. In the RL circuit simulation, the input voltage is an ideal sinusoidal voltage with a fixed frequency and increasing amplitude (as shown in FIG. 8). When the inductor in the RL circuit is a linear inductor, the current variation is shown in FIG. 9A and FIG. 9B, where FIG. 9B shows the detailed waveform of part of the time period in FIG. 9A. When the inductor in the RL circuit is a nonlinear inductor, the current variation is shown in FIG. 10A and FIG. 10B, where FIG. 10B shows the detailed waveform of part of the time period in FIG. 10A. It can be seen that the variation characteristics of the current satisfy the measured waveform shown in FIG. 6. Therefore, if the test signals are applied to the d-axis and the q-axis of the reluctance motor 2 respectively and the relation between the voltage variation and the current variation is extracted, the inductance-current curves of the reluctance motor 2 in the d-axis and q-axis can be derived from the basic formula of the voltage, current and inductance $$\left( v_L = L \frac{di_L}{dt} \right).$$

Figure 10C:
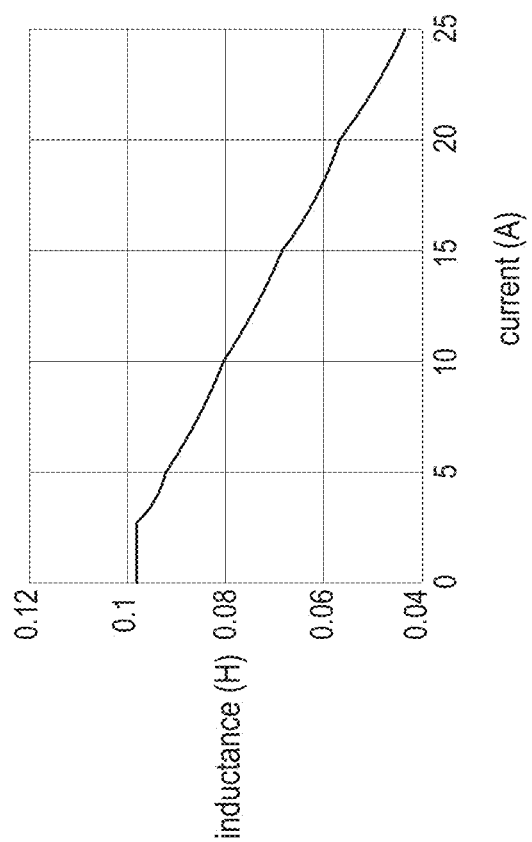
FIG. 10C schematically shows the inductance-current curve under the circumstance that the inductor of the RL circuit in FIG. 7 is a nonlinear inductor.

For example, when the linear inductor is adopted, the inductance-current curve shown in FIG. 9C is derived from FIG. 8 and FIG. 9A; when the nonlinear inductor is adopted, the inductance-current curve shown in FIG. 10C is derived from FIG. 8 and FIG. 10A The way of acquiring the inductance curve of the reluctance motor 2 on the d-axis is described in detail as follows.

Figure 11A:
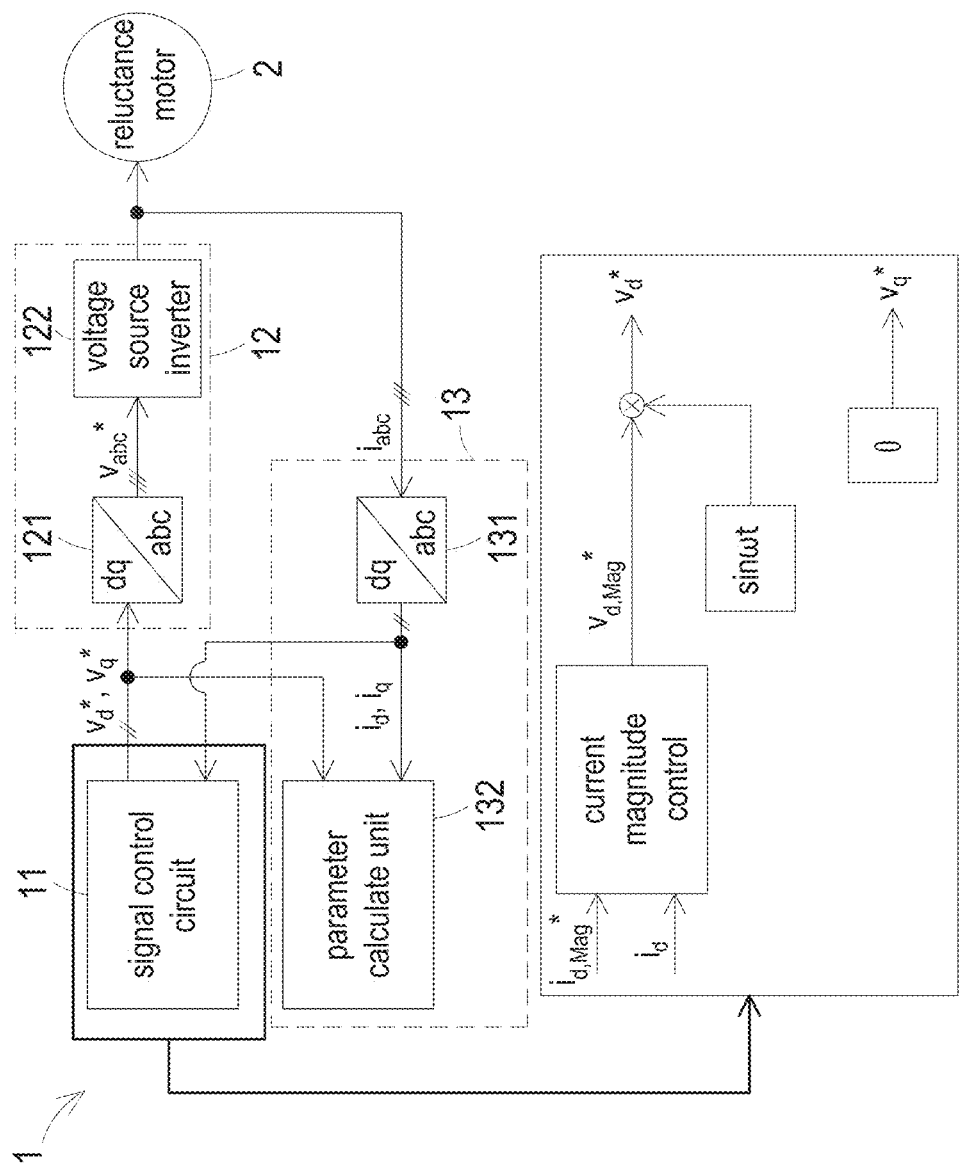
FIG. 11A and FIG. 11B schematically show an implementation of acquiring a d-axis inductance curve of the reluctance motor.

In order to acquire the inductance curve of the reluctance motor 2 on the d-axis, the high-frequency sinusoidal signal and the align signal command should be injected in the d-axis direction and the q-axis direction respectively so that the reluctance motor 2 is maintained at static state (or oscillates slightly but not rotates). As shown in FIG. 11A, when the signal control circuit 11 receives the high-frequency sinusoidal signal injected in the d-axis direction, the signal control circuit 11 samples the d-axis current component $i_d$ of the motor feedback signal through the feedback control circuit 13. Then, the signal control circuit 11 calculates a first amplitude difference between the high-frequency sinusoidal signal and the d-axis current component $i_d$, and the signal control circuit 11 modifies the amplitude of the high-frequency sinusoidal signal according to the first amplitude difference for regulating the feedback amplitude (i.e., the amplitude of the d-axis current component $i_d$). In specific, the signal control circuit 11 calculates the first amplitude difference between the current amplitude $i_{d,Mag}*$ of the high-frequency sinusoidal signal and the amplitude of the d-axis current component $i_d$, and modifies the voltage amplitude $v_{d,Mag}*$ of the high-frequency sinusoidal signal according to the first amplitude difference. This adjusting process would continue until the amplitude of the d-axis current component $i_d$ reaches the expected amplitude (i.e., the current amplitude $i_{d,Mag}*$). Afterwards, after the adjusting process, the voltage amplitude $v_{d,Mag}*$ of the high-frequency sinusoidal signal is multiplied by a sine wave signal to obtain the d-axis voltage component $v_d*$ of the dq-axes signal. The frequency of the sine wave signal is determined by taking both the output voltage limitation and maintaining the reluctance motor 2 in the static state into consideration. In particular, if the frequency of the sine wave signal is too low, the rotor may vibrate or even the reluctance motor 2 may rotate. On the contrary, if the frequency of the sine wave signal is too high, the output voltage may be insufficient.

Figure 11B:
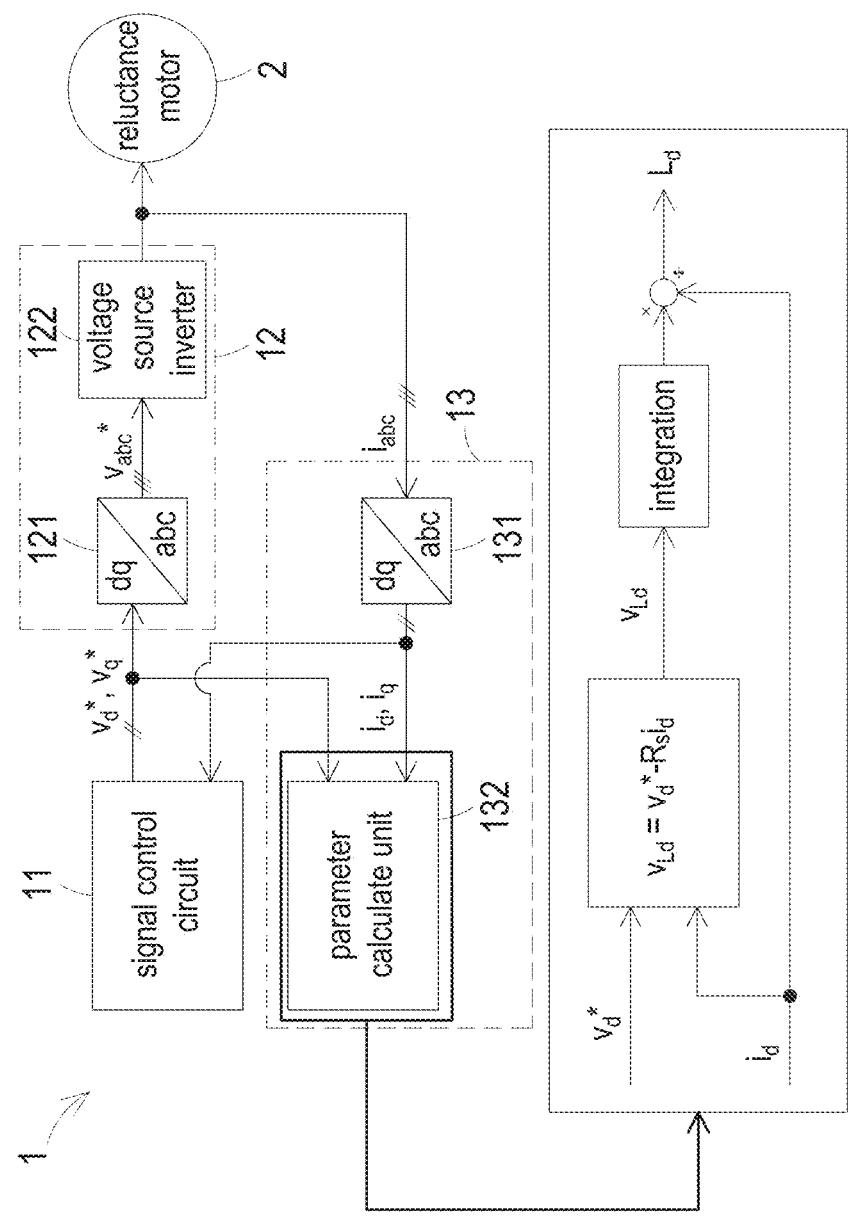

As shown in FIG. 11B, when the feedback control circuit 13 detects that the amplitude of the d-axis current component $i_d$ reaches the expected amplitude, the feedback control circuit 13 calculates the d-axis inductance of the apparent inductance based on the dq-axes signal, the motor feedback signal and the stator resistance. In detail, the equation (7) is obtained according to the above equation (5).

$$v_d^* - R_s i_d = L_d(i_d)\frac{d}{dt}i_d \qquad (7)$$

$L_d(i_d)$ represents that the inductance is a function of the current. The left-hand side of the equation (7) is the voltage $v_{Ld}$ across the inductor of the RL circuit.

The feedback control circuit 13 integrates and shifts the left-hand side and the right-hand side of the equation (7) to obtain a curve of the d-axis inductance $L_d$ in a cycle. The integral calculation in this calculation process may be realized by a second-order generalized integrator (SOGI) to avoid zero offset and accelerating the transient convergence, but this function is not limited to be realized by this type of integrator.

In addition, please refer to FIG. 11A again, when the high-frequency sinusoidal signal is injected in the d-axis direction, the align signal command injected in the q-axis direction is at the zero signal level so that the reluctance motor 2 stops rotating. The align signal command is for example but not limited to a zero current. In an embodiment, the inductance detection method further includes: sampling the q-axis current component $i_q$ of the motor feedback signal; and subtracting the align signal command from the q-axis current component $i_q$ for regulating the q-axis voltage component $v_q*$ of the dq-axes signal and making the reluctance motor 2 stop moving.

The way of acquiring the inductance curve of the reluctance motor 2 on the q-axis is described in detail as follows.

Figure 12A:
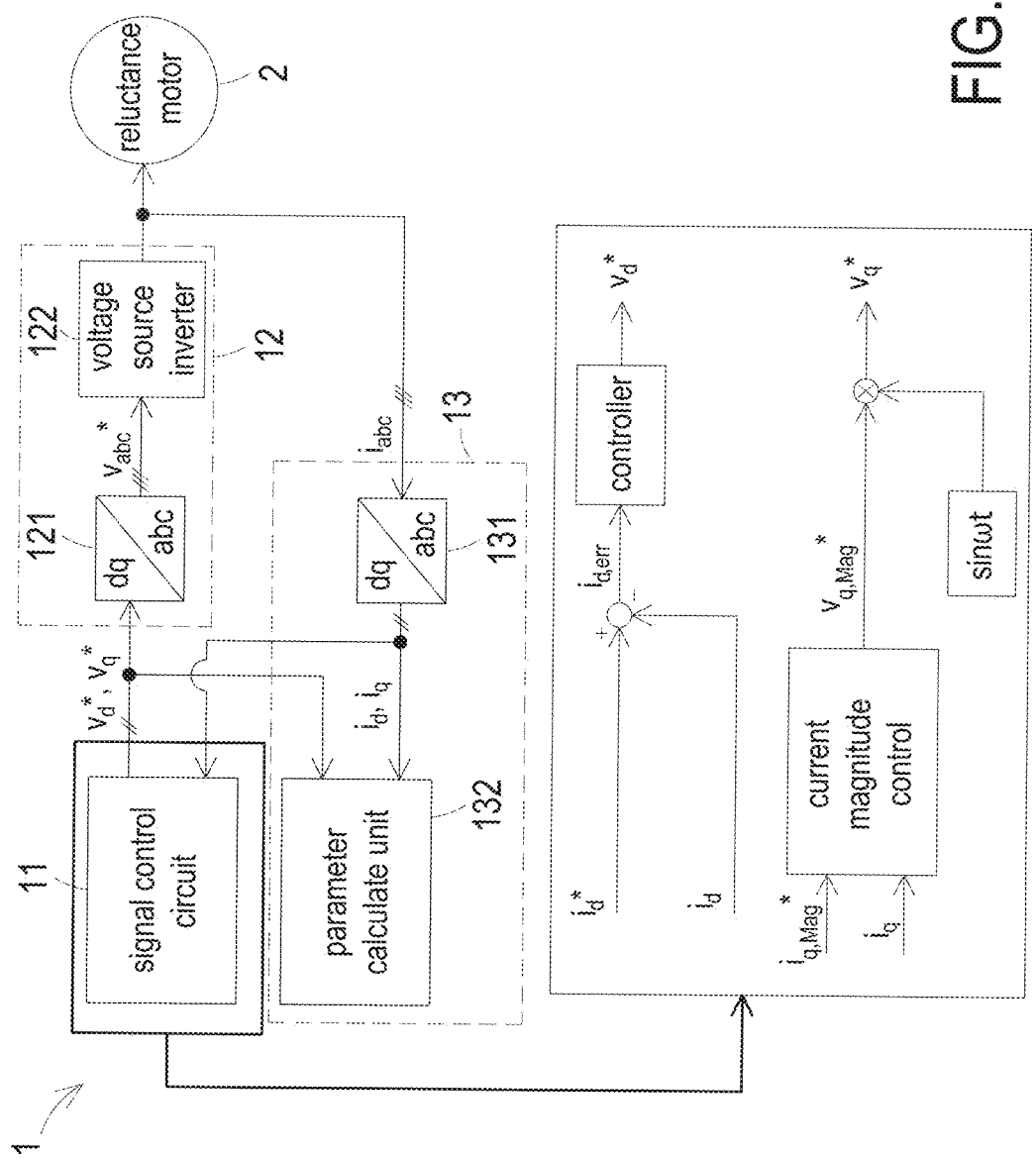
FIG. 12A and FIG. 12B schematically show an implementation of acquiring a q-axis inductance curve of the reluctance motor.

In order to acquire the inductance curve of the reluctance motor 2 on the q-axis, the high-frequency sinusoidal signal and the align signal command should be injected in the q-axis direction and the d-axis direction respectively so that the reluctance motor 2 is maintained at static state (or oscillates slightly but not rotates). As shown in FIG. 12A, when the signal control circuit 11 receives the high-frequency sinusoidal signal injected in the q-axis direction, the signal control circuit 11 samples the q-axis current component $i_q$ of the motor feedback signal through the feedback control circuit 13. Then, the signal control circuit 11 calculates a second amplitude difference between the high-frequency sinusoidal signal and the q-axis current component $i_q$, and the signal control circuit 11 modifies the amplitude of the high-frequency sinusoidal signal according to the second amplitude difference for regulating the feedback amplitude (i.e., the amplitude of the q-axis current component $i_q$. In specific, the signal control circuit 11 calculates the second amplitude difference between the current amplitude $i_{q,Mag}*$ of the high-frequency sinusoidal signal and the amplitude of the q-axis current component $i_q$, and modifies the voltage amplitude $v_{q,Mag}*$ of the high-frequency sinusoidal signal according to the second amplitude difference. This adjusting process would continue until the amplitude of the q-axis current component $i_q$ reaches the expected amplitude (i.e., the current amplitude $i_{q,\,Mag}*$). Afterwards, after the adjusting process, the voltage amplitude $v_{q,Mag}*$ of the high-frequency sinusoidal signal is multiplied by a sine wave signal to obtain the q-axis voltage component $v_q*$ of the dq-axes signal. The frequency of the sine wave signal is determined by taking both the output voltage limitation and maintaining the reluctance motor 2 in the static state into consideration. In particular, if the frequency of the sine wave signal is too low, the rotor may vibrate or even the reluctance motor 2 may rotate. On the contrary, if the frequency of the sine wave signal is too high, the output voltage may be insufficient.

Figure 12B:
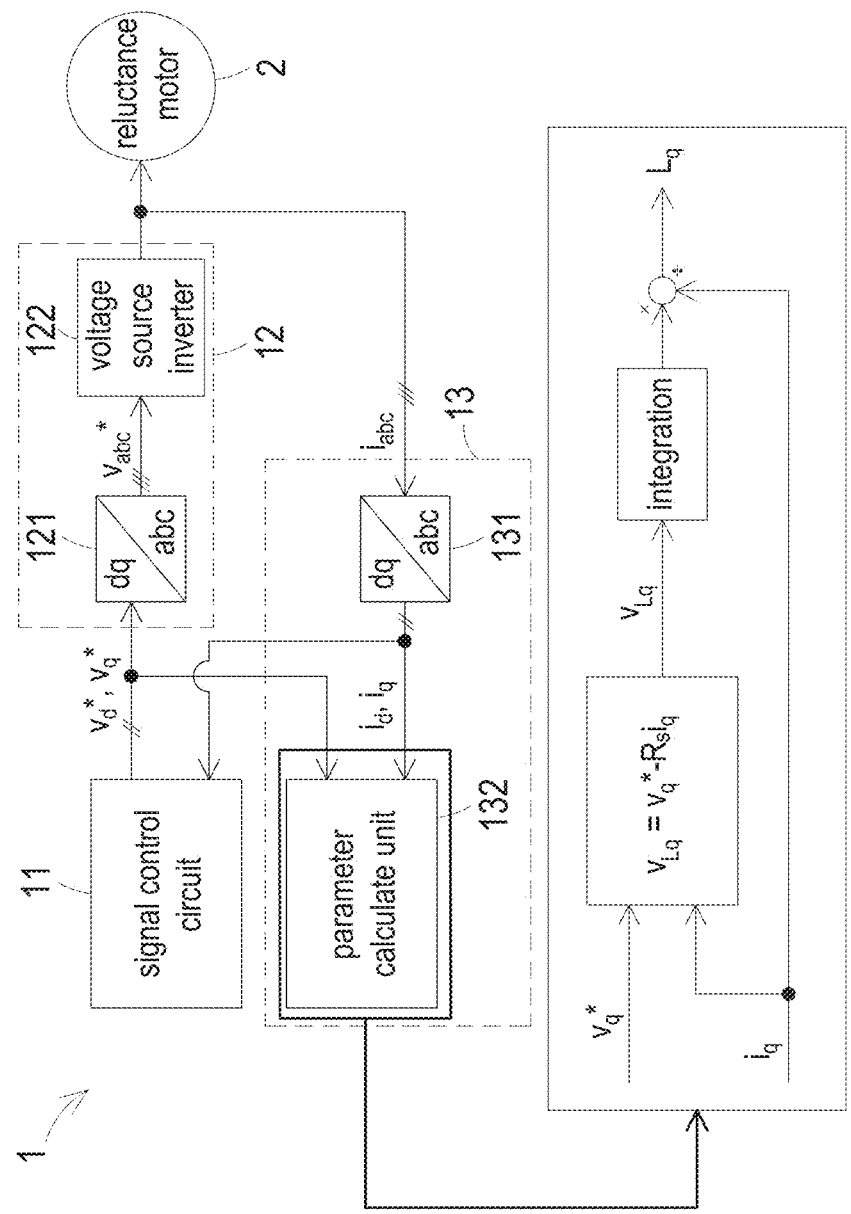

As shown in FIG. 12B, when the feedback control circuit 13 detects that the amplitude of the q-axis current component $i_q$ reaches the expected amplitude, the feedback control circuit 13 calculates the q-axis inductance of the apparent inductance based on the dq-axes signal, the motor feedback signal and the stator resistance. In detail, the equation (10) is obtained according to the above equation (6).

$$v_q^* - R_s i_q = L_q(i_q)\frac{d}{dt}i_q \qquad (10)$$

$L_q(i_q)$ represents that the inductance is a function of the current. The left-hand side of the equation (10) is the voltage vu across the inductor of the RL circuit.

The feedback control circuit 13 integrates and shifts the left-hand side and the right-hand side of the equation (10) to obtain a curve of the q-axis inductance $L_q$ in a cycle. The integral calculation in this calculation process may be realized by a second-order generalized integrator (SOGI) to avoid zero offset and accelerating the transient convergence, but this function is not limited to be realized by this type of integrator.

In addition, please refer to FIG. 12A again, when the high-frequency sinusoidal signal is injected in the q-axis direction, the align signal command injected in the d-axis direction is a DC blocked-rotor current for making the reluctance motor 2 stop moving. In an embodiment, the inductance detection method further includes: sampling the d-axis current component $i_d$ of the motor feedback signal; and subtracting the DC blocked-rotor current $i_d$* from the d-axis current component $i_d$ for regulating the d-axis voltage component $v_d$* of the dq-axes signal and making the reluctance motor 2 stop moving.

In conclusion, the present disclosure provides an inductance detection method of reluctance motor and a motor detection device, which can acquire the apparent inductance curve of the reluctance motor quickly with the rotor of the reluctance motor in the static state. Consequently, the parameter detection time is shortened, and meanwhile the resolution of the data points is improved.

While the disclosure has been described in terms of what is presently considered to be the most practical and preferred embodiments, it is to be understood that the disclosure needs not be limited to the disclosed embodiment.

What is claimed is:

1. An inductance detection method of a reluctance motor, comprising:
   injecting DC current signals with different signal levels in a d-axis direction, injecting a zero current in a q-axis direction, and acquiring a stator resistance of the reluctance motor accordingly;
   injecting a high-frequency sinusoidal signal in the d-axis direction or the q-axis direction;
   injecting an align signal command in the q-axis direction or the d-axis direction;
   receiving a dq-axes signal generated through injecting the high-frequency sinusoidal signal and the align signal command;
   sampling a motor feedback signal generated through receiving the dq-axes signal;
   in the direction of injecting the high-frequency sinusoidal signal, calculating an amplitude difference between the high-frequency sinusoidal signal and the motor feedback signal, and adjusting an amplitude of the high-frequency sinusoidal signal according to the amplitude difference for regulating a feedback amplitude of the motor feedback signal; and
   wherein when the feedback amplitude reaches an expected amplitude, an apparent inductance of the reluctance motor is calculated based on the dq-axes signal, the motor feedback signal and the stator resistance.

2. The inductance detection method according to claim 1, wherein when the high-frequency sinusoidal signal is injected in the d-axis direction, the inductance detection method further comprising:
   sampling a d-axis current component of the motor feedback signal;
   calculating a first amplitude difference between the high-frequency sinusoidal signal and the d-axis current component;
   adjusting the amplitude of the high-frequency sinusoidal signal according to the first amplitude difference for regulating the feedback amplitude, wherein the feedback amplitude is an amplitude of the d-axis current component; and
   wherein when the amplitude of the d-axis current component reaches the expected amplitude, a d-axis inductance of the apparent inductance is calculated based on the dq-axes signal, the motor feedback signal and the stator resistance.

3. The inductance detection method according to claim 2, further comprising:
   obtaining a first equation through the dq-axes signal, the motor feedback signal and the stator resistance, wherein the first equation is:

$$v_d^* - R_s i_d = L_d(i_d)\frac{d}{dt}i_d,$$

where $v_d$* is a d-axis voltage component of the dq-axes signal, $R_s$ is the stator resistance, $i_d$ is the d-axis current component of the motor feedback signal, $L_d$ is the d-axis inductance of the reluctance motor; and
   integrating and shifting a left-hand side and a right-hand side of the first equation to obtain a first curve of the d-axis inductance.

4. The inductance detection method according to claim 2, wherein when the high-frequency sinusoidal signal is injected in the d-axis direction, the align signal command injected in the q-axis direction is at a zero signal level, and the inductance detection method further comprises:
   sampling a q-axis current component of the motor feedback signal; and
   subtracting the align signal command from the q-axis current component for regulating a q-axis voltage component of the dq-axes signal and making the reluctance motor stop moving.

5. The inductance detection method according to claim 1, wherein when the high-frequency sinusoidal signal is injected in the q-axis direction, the inductance detection method further comprising:
   sampling a q-axis current component of the motor feedback signal;
   calculating a second amplitude difference between the high-frequency sinusoidal signal and the q-axis current component;
   adjusting the amplitude of the high-frequency sinusoidal signal according to the second amplitude difference for regulating the feedback amplitude, wherein the feedback amplitude is an amplitude of the q-axis current component; and
   wherein when the amplitude of the q-axis current component reaches the expected amplitude, a q-axis inductance of the apparent inductance is calculated based on the dq-axes signal, the motor feedback signal and the stator resistance.

6. The inductance detection method according to claim 5, further comprising:
   obtaining a second equation through the dq-axes signal, the motor feedback signal and the stator resistance, wherein the second equation is:

$$v_q^* - R_s i_q = L_q(i_q)\frac{d}{dt}i_q,$$

where $v_q$* is a q-axis voltage component of the dq-axes signal, $R_s$ is the stator resistance, $i_q$ is the q-axis current component of the motor feedback signal, $L_q$ is the q-axis inductance of the reluctance motor; and integrating and shifting a left-hand sides and a right-hand side of the second equation to obtain a second curve of the q-axis inductance.

7. The inductance detection method according to claim 5, wherein when the high-frequency sinusoidal signal is injected in the q-axis direction, the align signal command injected in the d-axis direction is a DC align signal command, and the inductance detection method further comprises:

sampling a d-axis current component of the motor feedback signal; and subtracting the DC align signal command from the d-axis current component for regulating a d-axis voltage component of the dq-axes signal and making the reluctance motor stop moving.

8. A motor detection device, configured to detect an apparent inductance of a reluctance motor, and comprising:

a signal control circuit, configured to output a dq-axes signal;

a motor driving circuit, receiving the dq-axes signal to generate a driving signal; and a feedback control circuit, comprising a stator resistance of the reluctance motor, wherein the feedback control circuit samples the driving signal to generate a motor feedback signal, wherein the signal control circuit receives a high-frequency sinusoidal signal injected in a d-axis direction or a q-axis direction and an align signal command injected in the q-axis direction or the d-axis direction to generate the dq-axes signal;

wherein in the direction of injecting the high-frequency sinusoidal signal, the signal control circuit calculates an amplitude difference between the high-frequency sinusoidal signal and the motor feedback signal, and the signal control circuit modifies an amplitude of the high-frequency sinusoidal signal according to the amplitude difference for regulating a feedback amplitude of the motor feedback signal;

wherein when the feedback control circuit detects that the feedback amplitude reaches an expected amplitude, the feedback control circuit calculates the apparent inductance based on the dq-axes signal, the motor feedback signal and the stator resistance.

9. The motor detection device according to claim 8, wherein if the signal control circuit receives the high-frequency sinusoidal signal injected in the d-axis direction, the signal control circuit samples a d-axis current component of the motor feedback signal through the feedback control circuit;

the signal control circuit calculates a first amplitude difference between the high-frequency sinusoidal signal and the d-axis current component;

the signal control circuit modifies the amplitude of the high-frequency sinusoidal signal according to the first amplitude difference for regulating the feedback amplitude, wherein the feedback amplitude is an amplitude of the d-axis current component; and when the feedback control circuit detects that the amplitude of the d-axis current component reaches the expected amplitude, the feedback control circuit calculates a d-axis inductance of the apparent inductance based on the dq-axes signal, the motor feedback signal and the stator resistance.

10. The motor detection device according to claim 9, wherein when the signal control circuit receives the high-frequency sinusoidal signal injected in the d-axis direction, the align signal command injected in the q-axis direction and received by the signal control circuit is at a zero signal level so that the reluctance motor stops moving.

11. The motor detection device according to claim 9, wherein the feedback control circuit obtains a first equation through the dq-axes signal, the motor feedback signal and the stator resistance, wherein the first equation is:

$$v_d^* - R_s i_d = L_d(i_d)\frac{d}{dt}i_d,$$

where $v_d^*$ is a d-axis voltage component of the dq-axes signal, $R_s$ is the stator resistance, $i_d$ is the d-axis current component of the motor feedback signal, $L_d$ is the d-axis inductance of the reluctance motor; and the feedback control circuit integrates and shifts a left-hand side and a right-hand side of the first equation to obtain a first curve of the d-axis inductance.

12. The motor detection device according to claim 8, wherein if the signal control circuit receives the high-frequency sinusoidal signal injected in the q-axis direction, the signal control circuit samples a q-axis current component of the motor feedback signal through the feedback control circuit;

the signal control circuit calculates a second amplitude difference between the high-frequency sinusoidal signal and the q-axis current component;

the signal control circuit modifies the amplitude of the high-frequency sinusoidal signal according to the second amplitude difference for regulating the feedback amplitude, wherein the feedback amplitude is an amplitude of the q-axis current component; and when the feedback control circuit detects that the amplitude of the q-axis current component reaches the expected amplitude, the feedback control circuit calculates a q-axis inductance of the apparent inductance based on the dq-axes signal, the motor feedback signal and the stator resistance.

13. The motor detection device according to claim 12, wherein when the signal control circuit receives the high-frequency sinusoidal signal injected in the q-axis direction, the align signal command injected in the d-axis direction and received by the signal control circuit is a DC align signal command so that the reluctance motor stops moving.

14. The motor detection device according to claim 12, wherein the feedback control circuit obtains a second equation through the dq-axes signal, the motor feedback signal and the stator resistance, wherein the second equation is:

$$v_q^* - R_s i_q = L_q(i_q)\frac{d}{dt}i_q,$$

where $v_q^*$ is a q-axis voltage component of the dq-axes signal, $R_s$ is the stator resistance, $i_q$ is the q-axis current component of the motor feedback signal, $L_q$ is the q-axis inductance of the reluctance motor; and the feedback control circuit integrates and shifts a left-hand side and a right-hand side of the second equation to obtain a second curve of the q-axis inductance.

* * * * *